(12) United States Patent
He et al.

(10) Patent No.: US 8,970,407 B2
(45) Date of Patent: *Mar. 3, 2015

(54) METHODS AND DEVICES FOR PARALLEL ENCODING AND DECODING USING A BITSTREAM STRUCTURED FOR REDUCED DELAY

(71) Applicant: Blackberry Limited, Waterloo (CA)

(72) Inventors: Dake He, Waterloo (CA); Gergely Ferenc Korodi, Waterloo (CA); Gaelle Christine Martin-Cocher, Toronto (CA); En-hui Yang, Petersburg (CA)

(73) Assignee: BlackBerry Limited, Waterloo (CA)

( * ) Notice: Subject to any disclaimer, the term of this patent is extended or adjusted under 35 U.S.C. 154(b) by 0 days.

This patent is subject to a terminal disclaimer.

(21) Appl. No.: 13/956,741

(22) Filed: Aug. 1, 2013

(65) Prior Publication Data

US 2013/0315316 A1 Nov. 28, 2013

Related U.S. Application Data

(63) Continuation of application No. 13/249,707, filed on Sep. 30, 2011, now Pat. No. 8,519,871.

(60) Provisional application No. 61/388,768, filed on Oct. 1, 2010.

(51) Int. Cl.
*H03M 7/00* (2006.01)
*H04N 19/60* (2014.01)
(Continued)

(52) U.S. Cl.
CPC .......... *H04N 19/00775* (2013.01); *H03M 7/30* (2013.01); *H03M 7/4006* (2013.01); *H03M 7/46* (2013.01); *H03M 7/40* (2013.01); *H03M 7/6023* (2013.01)
USPC ........................................... 341/107; 341/51

(58) Field of Classification Search
CPC ....... H03M 7/4006; H03M 7/30; H03M 7/46; H03M 7/40

USPC ............................ 341/107, 51, 60, 63, 65, 67
See application file for complete search history.

(56) References Cited

U.S. PATENT DOCUMENTS

| 5,583,500 | A | 12/1996 | Allen et al. |
| 7,990,297 | B1 | 8/2011 | Korodi et al. |
| 8,519,871 | B2 * | 8/2013 | He et al. ........................ 341/107 |

(Continued)

FOREIGN PATENT DOCUMENTS

| GB | 2311705 | 10/1997 |
| GB | 2319689 | 5/1998 |
| WO | 2009119888 | 10/2009 |

OTHER PUBLICATIONS

Korodi et al., Title: Methods and Devices for Load Balancing in Parallel Entropy Coding and Decoding, U.S. Appl. No. 12/758,905, filed Apr. 13, 2010.

(Continued)

*Primary Examiner* — Joseph Lauture
(74) *Attorney, Agent, or Firm* — Rowand LLP

(57) ABSTRACT

Methods and devices for encoding and decoding that involve sorting bins according to their respective estimated probabilities to form subsequences, each subsequence having an associated estimated probability. Subsequences are encoded to form codewords. Ordered sets of phrases of known length are then formed from the codewords. Each first of the phrases in a set contains at least part of one codeword. The first phrase has an associated estimated probability and the probability estimates associated with each of the other phrases in the set are determined based upon the probability estimate associated with the first phrase, which permits the phrases to be decoded in parallel.

20 Claims, 12 Drawing Sheets

(51) Int. Cl.
*H03M 7/30* (2006.01)
*H03M 7/40* (2006.01)
*H03M 7/46* (2006.01)

(56) References Cited

U.S. PATENT DOCUMENTS

2006/0242475 A1 10/2006 Sandhu et al.
2011/0200104 A1 8/2011 Korodi et al.

OTHER PUBLICATIONS

He, Dake et al., Methods and Devices for Reordered Parallel Entropy Coding and Decoding, U.S. Appl. No. 13/089,599, filed Apr. 19, 2011.

He, Dake et al., Methods and Devices for Data Compression Using Context-Based Coding Order, U.S. Appl. No. 13/181,576, filed Jul. 13, 2011.

PCT International Written Opinion and Search Report, relating to application No. PCT/CA2011/050614 dated Jan. 26 2012.

EPO, Extended European Search Report relating to Application No. 11827882.9, dated Jun. 16, 2014.

Daniel Frederic Finchelstein: "Low-Power Techniques for Video Decoding", dated Jun. 2009, XP055117706.

Marpe D et al: "Context-Based Adaptive Binary Arithmetic Coding in the H.264/AVC Video Compression Standard", dated Jul. 1, 2003, XP011099255.

* cited by examiner $x_1$ $x_2$ $x_3$ $x_4$ $x_5$ $x_6$ $x_7$ $x_8$ $x_9$ $x_{10}$ $x_{11}$ $x_{12}$ $x_{13}$ $x_{14}$ $x_{15}$ $x_{16}$ $x_{17}$ $x_{18}$ $x_{19}$ $x_{20}$ $x_{21}$
$p_1$ $p_1$ $p_0$ $p_1$ $p_2$ $p_0$ $p_0$ $p_1$ $p_1$ $p_1$ $p_1$ $p_1$ $p_1$ $p_2$ $p_2$ $p_0$ $p_0$ $p_2$ $p_2$ $p_1$ $p_1$
$x_{22}$ $x_{23}$ $x_{24}$ $x_{25}$ $x_{26}$ $x_{27}$ $x_{28}$ $x_{29}$ $x_{30}$
$p_2$ $p_2$ $p_0$ $p_0$ $p_0$ $p_0$ $p_0$ $p_0$ $p_1$

$A_1$: $[b_{1,1}\ b_{1,2}][b_{1,3}\ b_{1,4}$
$B_1$: $[b_{1,7}\ b_{1,8}]\quad \#\quad \#$ $A_2$: $[b_{0,1}\ b_{0,2}][b_{0,3}\ b_{0,4}$
$B_2$: $[b_{0,6}\ b_{0,7}][b_{0,8}\ b_{0,9}]$ $A_3$: $[b_{21}][b_{22}\ b_{23}\ b_{24}]$
$B_3$: $[b_{25}]\quad \#\quad \#\quad \#$ $A_4$: $b_{1,5}\ b_{1,6}]\quad \#\quad \#$
$B_4$: $\#\quad \#\quad \#\quad \#$ $A_5$: $b_{0,5}]\quad \#\quad \#\quad \#$
$B_5$: $\#\quad \#\quad \#\quad \#$

FIG. 10

$A_1$: $[b_{1,1}\ b_{1,2}][b_{1,3}\ b_{1,4}$
$B_1$: $[b_{2,1}][b_{2,2}\ b_{2,3}\ b_{2,4}]$ $A_2$: $[b_{0,1}\ b_{0,2}][b_{0,3}\ b_{0,4}$
$B_2$: $b_{1,5}\ b_{1,6}][b_{1,7}\ b_{1,8}]$ $A_3$: $b_{0,5}][b_{0,6}\ b_{0,7}][b_{0,8}$
$B_3$: $\#\quad \#\quad \#\quad \#$ $A_4$: $[b_{2,5}]\quad \#\quad \#\quad \#$
$B_4$: $b_{0,9}]\quad \#\quad \#\quad \#$

FIG. 11

METHODS AND DEVICES FOR PARALLEL ENCODING AND DECODING USING A BITSTREAM STRUCTURED FOR REDUCED DELAY

CROSS-REFERENCE TO RELATED APPLICATIONS

The present application claims priority to U.S. patent application Ser. No. 61/388,768 filed Oct. 1, 2010, and U.S. patent application Ser. No. 13/249,707 filed Sep. 30, 2010, the contents of which are both hereby incorporated by reference.

FIELD

The present application generally relates to data compression and, in particular, to methods and devices for parallel encoding and decoding that use a bitstream structured to reduce delay.

BACKGROUND

Data compression occurs in a number of contexts. It is very commonly used in communications and computer networking to store, transmit, and reproduce information efficiently. It finds particular application in the encoding of images, audio and video. Video presents a significant challenge to data compression because of the large amount of data required for each video frame and the speed with which encoding and decoding often needs to occur. The current state-of-the-art for video encoding is the ITU-T H.264/AVC video coding standard. It defines a number of different profiles for different applications, including the Main profile, Baseline profile and others. A next-generation video encoding standard is currently under development through a joint initiative of MPEG-ITU: High Efficiency Video Coding (HEVC).

There are a number of standards for encoding/decoding images and videos, including H.264, that employ lossy compression processes to produce binary data. For example, H.264 includes a prediction operation to obtain residual data, followed by a DCT transform and quantization of the DCT coefficients. The resulting data, including quantized coefficients, motion vectors, coding mode, and other related data, is then entropy coded to generate a bitstream of data for transmission or storage on a computer-readable medium. It is expected that HEVC will also have these features.

A number of coding schemes have been developed to encode binary data. For example, JPEG images may be encoded using Huffman codes. The H.264 standard allows for two possible entropy coding processes: Context Adaptive Variable Length Coding (CAVLC) or Context Adaptive Binary Arithmetic Coding (CABAC). CABAC results in greater compression than CAVLC, but CABAC is more computationally demanding. Other schemes may use Tunstall codes. In any of these cases, the coding scheme operates upon the binary data to produce a serial bitstream of encoded data. At the decoder, the decoding scheme receives the bitstream and entropy decodes the serial bitstream to reconstruct the binary data.

Some work has been done to introduce parallelism into the entropy coding and/or entropy decoding processes. However, in many such cases the parallel encoding requires the output of the bitstream to be delayed until a certain amount of data has been encoded. For example, under some processes it may be necessary to code an entire slice or frame of data before the encoded bitstream can be output. This delay may be unacceptably long in the case of real-time video applications, such as video conferencing.

It would be advantageous to provide for an improved encoder, decoder and method of encoding or decoding that allows for parallelism in encoding, but with reduced delay.

BRIEF DESCRIPTION OF THE DRAWINGS

Reference will now be made, by way of example, to the accompanying drawings which show example embodiments of the present application, and in which:

FIG. 6 illustrates a simplified example input sequence, the parsing of the sequence, and the generation of corresponding codewords;

FIG. 7 illustrates the structure of an example bitstream formed using one example entropy coding process;

FIG. 8 illustrates the structure of an example bitstream formed using another example entropy coding process;

FIG. 9 illustrates the structure of an example bitstream formed using a third example entropy coding process;

FIG. 10 illustrates the structure of a first example bitstream formed to have a set of phrases formed so as to be decoded in parallel;

FIG. 11 illustrates the structure of a second example bitstream formed to have a set of phrases formed so as to be decoded in parallel;

Similar reference numerals may have been used in different figures to denote similar components.

DESCRIPTION OF EXAMPLE EMBODIMENTS

Figure 1:
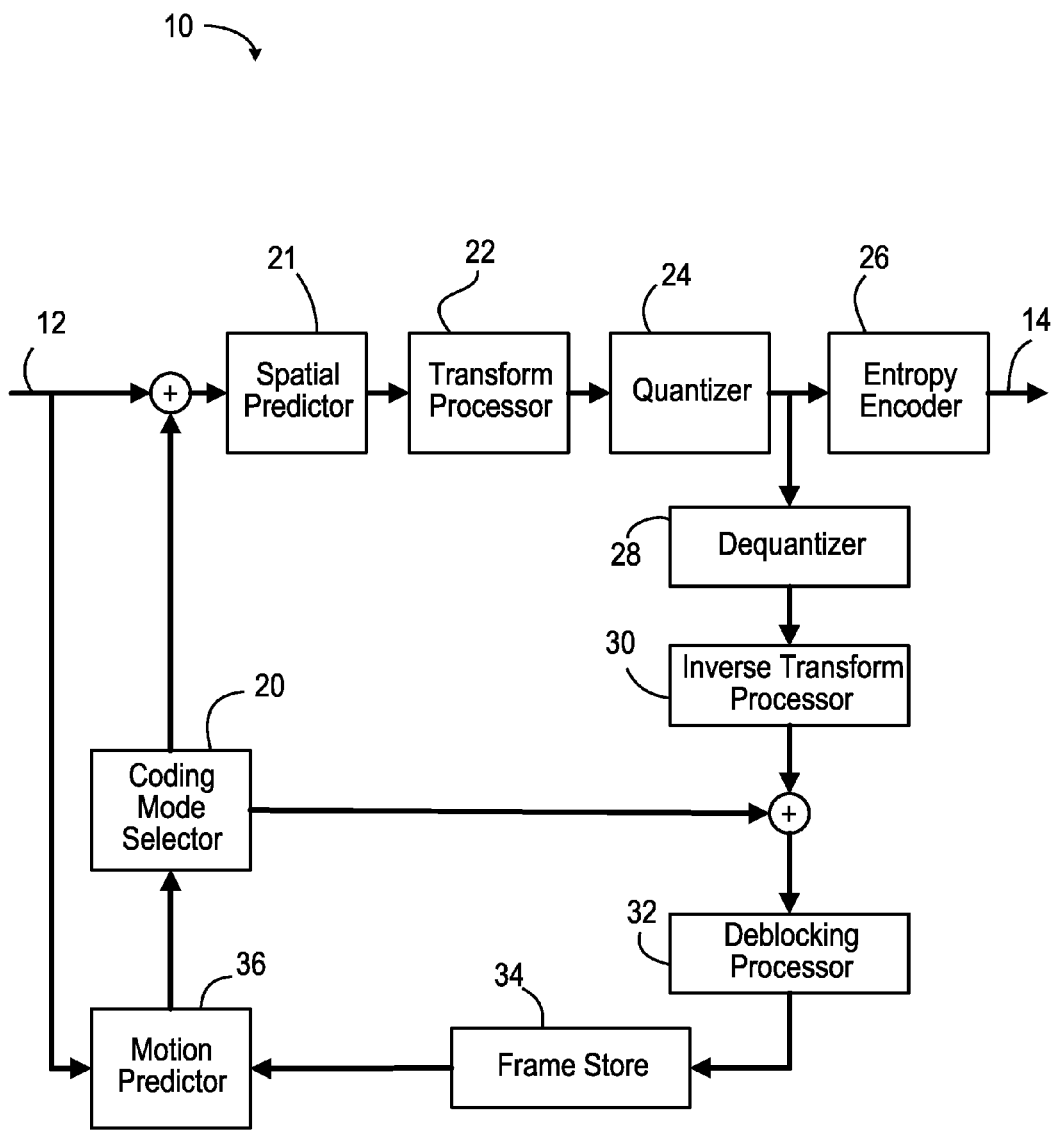
FIG. 1 shows, in block diagram form, an encoder for encoding video.

In one aspect, the present application describes a method for encoding an input sequence of bins. The method includes parsing the input sequence into subsequences of bins, each subsequence of bins being associated with a respective one of a predefined number of probability estimates; parallel entropy coding the subsequences of bins to generate subsequences of codewords, wherein each subsequence of codewords is associated with its respective one of the predefined number of probability estimates; and interleaving the subsequences of codewords to form an encoded sequence by determining from a context model a first probability estimate, forming an ordered set of phrases, the first phrase in the set containing at least a portion of a codeword from the subsequence of codewords associated with the first probability estimate, each of the remaining phrases containing at least a portion of a codeword from the subsequence of codewords associated with a respective probability estimate, wherein the respective probability estimate is identified based upon the first probability estimate, and repeating the determining and the forming until all the codewords from the subsequences of codewords are interleaved into sets of phrases, wherein the encoded sequence comprises a concatenation of the sets of phrases.

In another aspect, the present application describes a method of decoding an encoded sequence, the encoded sequence having been encoded in accordance with a context model. The method includes reading an ordered set of two or more consecutive phrases from the encoded sequence, a first of the phrases in the set containing at least part of one codeword, wherein the phrases are bit strings of a known length; determining from the context model a probability estimate associated with the first of the phrases; identifying from the probability estimate of the first phrase, respective probability estimates associated with each of the other phrases in the set; entropy decoding at least a portion of each of the two or more phrases of the set in parallel in accordance with their respective associated probability estimates to create decoded phrase bits; updating the context model based upon at least some of the decoded phrase bits; and repeating the reading, determining, identifying, entropy decoding and updating.

In a further aspect, the present application describes a method for decoding an encoded sequence, the encoded sequence having been encoded in accordance with a context model. The method includes determining from the context model a probability estimate;

reading a phrase from the encoded sequence, the phrase containing at least an end portion of a first codeword and ending with a first portion of a second codeword, and wherein the phrase is a bit string of a known length; decoding at least the first codeword in accordance with the probability estimate; reading a subsequent phrase from the encoded sequence associated with the probability estimate, the subsequent phrase beginning with a second portion of the second codeword, wherein the second codeword is complete with the first portion and second portion concatenated; and decoding the second codeword in accordance with the probability estimate.

In another aspect, the present application describes a method for encoding an input sequence of bins, using a computing device, to produce encoded data. The method includes parsing, with the computing device, the input sequence into subsequences of bins, each subsequence of bins being associated with a respective one of a predefined number of probability estimates; arithmetically encoding, with the computing device, the subsequences of bins to generate subsequences of strings, wherein each subsequence of strings is associated with the respective one of the predefined number of probability estimates associated with the corresponding subsequence of bins; and interleaving, using the computing device, the subsequences of strings to form an encoded sequence. The interleaving includes determining from a context model a first probability estimate, forming an ordered set of phrases, the first phrase in the set containing at least a portion of a string from the subsequence of strings associated with the first probability estimate, each of the remaining phrases containing at least a portion of a string from the subsequence of strings associated with a respective probability estimate, wherein the respective probability estimate is identified based on the first probability estimate, and repeating the determining and the forming until all the strings from the subsequences of strings are interleaved into sets of phrases. The encoded sequence comprises a concatenation of the sets of phrases, and the respective probability estimates associated with each of the other phrases are identified without dependence upon the subsequence of bins encoded as the strings of the first of the phrases.

In a further aspect, the present application describes a method of decoding an encoded sequence, using a computing device, to obtain decoded data, the encoded sequence having been encoded in accordance with a context model using arithmetic coding. The method includes reading an ordered set of two or more consecutive phrases from the encoded sequence, a first of the phrases in the set containing at least part of one string of arithmetically-encoded data, wherein the phrases have a respective predetermined length; determining, with the computing device, from the context model a probability estimate associated with the first of the phrases; identifying, with the computing device, from the probability estimate of the first phrase, respective probability estimates associated with each of the other phrases in the set; arithmetically decoding, using the computing device, at least a portion of each of the two or more phrases of the set in parallel in accordance with their respective associated probability estimates to create decoded phrase bits; and updating, using the computing device, the context model based upon at least some of the decoded phrase bits. The respective probability estimates associated with each of the other phrases are determined without dependence upon decoding of the first of the phrases.

In yet a further aspect, the present application describes non-transitory computer-readable media storing computer-executable program instructions which, when executed, configure a processor to perform the described methods of encoding and/or decoding.

In yet another aspect, the present application describes non-transitory computer-readable media storing a computer-readable bitstream of encoded data structured in accordance with the constraints set out herein.

In another aspect, the present application describes an encoder. The encoder includes a processor; memory; and an encoding application stored in memory and containing instructions for configuring the processor to encode an input sequence in accordance with the methods described herein.

In yet a further aspect, the present application describes a decoder having a plurality of parallel entropy decoders. The decoder includes a processor; memory; and a decoding application stored in memory and containing instructions for configuring the processor to decode a bitstream in accordance with the methods described herein.

Other aspects and features of the present application will be understood by those of ordinary skill in the art from a detailed review of the following description of examples in conjunction with the accompanying figures.

In video coding and other coding applications, the binary symbols of an input sequence x are sometimes referred to as "bins". In the present application, the term "bin" should be understood to mean an input binary symbol.

Various methods, encoders and decoders are described in U.S. patent application Ser. No. 12/707,797 filed Feb. 18, 2010, and owned in common herewith, the contents of which are hereby incorporated by reference. Various methods, encoders and decoders are described in Ser. No. 12/713,613, filed Feb. 26, 2010, and owned in common herewith, the contents of which are hereby incorporated by reference. Various methods, encoders and decoders are described in U.S. patent application Ser. No. 12/758,905 filed Apr. 13, 2010, and owned in common herewith, the contents of which are hereby incorporated by reference.

The following description relates to data compression in general and, in particular, to the efficient parallel encoding of finite alphabet sources, such as a binary source.

In many of the examples given below, particular applications of such an encoding and decoding scheme are given. For example, many of the illustrations below make reference to video coding. It will be appreciated that the present application is not limited to video coding or image coding. In particular, in the description that follows some example embodiments are described with reference to the H.264 standard for video coding. The present application is not limited to H.264 but may be applicable to other video coding/decoding standards and formats, including possible future standards, such as HEVC, SVC or 3D Video standards and formats. It will also be appreciated that the present application is not necessarily limited to video coding/decoding and may be applicable to audio coding/decoding, image coding/decoding, or the lossy coding/decoding of any other data. The present application is broadly applicable to any data compression process that employs entropy coding and decoding.

Figure 2:
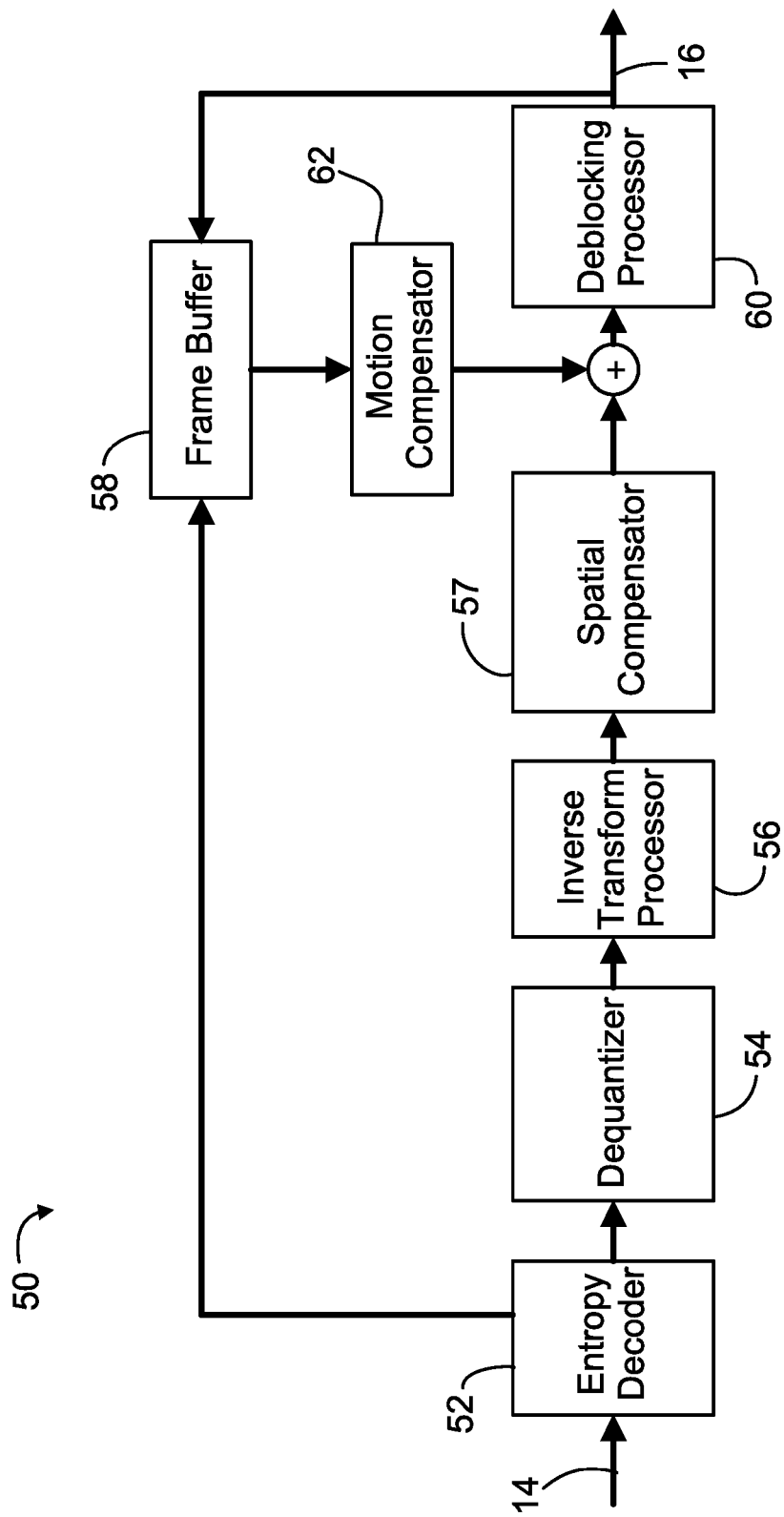
FIG. 2 shows, in block diagram form, a decoder for decoding video.

Reference is now made to FIG. 1, which shows, in block diagram form, an encoder 10 for encoding video. Reference is also made to FIG. 2, which shows a block diagram of a decoder 50 for decoding video. It will be appreciated that the encoder 10 and decoder 50 described herein may each be implemented on an application-specific or general purpose computing device, containing one or more processing elements and memory. The operations performed by the encoder 10 or decoder 50, as the case may be, may be implemented by way of application-specific integrated circuit, for example, or by way of stored program instructions executable by a general purpose processor. The device may include additional software, including, for example, an operating system for controlling basic device functions. The range of devices and platforms within which the encoder 10 or decoder 50 may be implemented will be appreciated by those ordinarily skilled in the art having regard to the following description.

The encoder 10 receives a video source 12 and produces an encoded bitstream 14. The decoder 50 receives the encoded bitstream 14 and outputs a decoded video frame 16. The encoder 10 and decoder 50 may be configured to operate in conformance with a number of video compression standards. For example, the encoder 10 and decoder 50 may be H.264/AVC compliant. In other embodiments, the encoder 10 and decoder 50 may conform to other video compression standards or formats, including evolutions of the H.264/AVC standard, such as HEVC.

The encoder 10 includes a spatial predictor 21, a coding mode selector 20, transform processor 22, quantizer 24, and entropy encoder 26. The coding mode selector 20 determines the appropriate coding mode for the video source, for example whether the subject frame/slice is of I, P, or B type, and whether particular macroblocks or coding units within the frame/slice are inter or intra coded. The transform processor 22 performs a transform upon the pixel domain data. In particular, the transform processor 22 applies a block-based transform to convert pixel domain data to spectral components. For example, in many embodiments a discrete cosine transform (DCT) is used. Other transforms, such as a discrete sine transform or others may be used in some instances. The block-based transform is performed on a coding unit or sub-coding-unit basis, depending on the size of the coding units. In the H.264 standard, for example, a typical 16×16 macroblock contains sixteen 4×4 transform blocks and the DCT process is performed on the 4×4 blocks. In some cases, the transform blocks may be 8×8, meaning there are four transform blocks per macroblock. In yet other cases, the transform blocks may be other sizes. In some cases, a 16×16 macroblock may include a non-overlapping combination of 4×4 and 8×8 transform blocks.

Applying the block-based transform to a block of pixel data results in a set of transform domain coefficients. A "set" in this context is an ordered set in which the coefficients have coefficient positions. In some instances the set of transform domain coefficients may be considered a "block" or matrix of coefficients. In the description herein the phrases a "set of transform domain coefficients" or a "block of transform domain coefficients" are used interchangeably and are meant to indicate an ordered set of transform domain coefficients.

The set of transform domain coefficients is quantized by the quantizer 24. The quantized coefficients and associated information are then encoded by the entropy encoder 26.

Intra-coded frames/slices (i.e. type I) are encoded without reference to other frames/slices. In other words, they do not employ temporal prediction. However intra-coded frames do rely upon spatial prediction within the frame/slice, as illustrated in FIG. 1 by the spatial predictor 21. That is, when encoding a particular block the data in the block may be compared to the data of nearby pixels within blocks already encoded for that frame/slice. Using a prediction algorithm, the source data of the block may be converted to residual data. The transform processor 22 then encodes the residual data. H.264, for example, prescribes nine spatial prediction modes for 4×4 transform blocks. In some embodiments, each of the nine modes may be used to independently process a block, and then rate-distortion optimization is used to select the best mode.

The H.264 standard also prescribes the use of motion prediction/compensation to take advantage of temporal prediction. Accordingly, the encoder 10 has a feedback loop that includes a de-quantizer 28, inverse transform processor 30, and deblocking processor 32. These elements mirror the decoding process implemented by the decoder 50 to reproduce the frame/slice. A frame store 34 is used to store the reproduced frames. In this manner, the motion prediction is based on what will be the reconstructed frames at the decoder 50 and not on the original frames, which may differ from the reconstructed frames due to the lossy compression involved in encoding/decoding. A motion predictor 36 uses the frames/slices stored in the frame store 34 as source frames/slices for comparison to a current frame for the purpose of identifying similar blocks. Accordingly, for macroblocks to which motion prediction is applied, the "source data" which the transform processor 22 encodes is the residual data that comes out of the motion prediction process. For example, it may include information regarding the reference frame, a spatial displacement or "motion vector", and residual pixel data that represents the differences (if any) between the prediction (reference block) and the current block. Information regarding the reference frame and/or motion vector may not be processed by the transform processor 22 and/or quantizer 24, but instead may be supplied to the entropy encoder 26 for encoding as part of the bitstream along with the quantized coefficients.

The decoder 50 includes an entropy decoder 52, dequantizer 54, inverse transform processor 56, spatial compensator 57, and deblocking processor 60. A frame buffer 58 supplies reconstructed frames for use by a motion compensator 62 in applying motion compensation. The spatial compensator 57 represents the operation of recovering the video data for a particular intra-coded block from a previously decoded block.

The bitstream 14 is received and decoded by the entropy decoder 52 to recover the quantized coefficients. Side information may also be recovered during the entropy decoding process, some of which may be supplied to the motion compensation loop for use in motion compensation, if applicable. For example, the entropy decoder 52 may recover motion vectors and/or reference frame information for inter-coded macroblocks.

The quantized coefficients are then dequantized by the dequantizer 54 to produce the transform domain coefficients, which are then subjected to an inverse transform by the inverse transform processor 56 to recreate the pixel domain "video data". It will be appreciated that, in some cases, such as with an intra-coded macroblock, the recreated "video data" is the residual data for use in spatial compensation relative to a previously decoded block within the frame. The spatial compensator 57 generates the video data from the residual data and reconstructed pixel data from a previously decoded block. In other cases, such as inter-coded macroblocks, the recreated "video data" from the inverse transform processor 56 is the residual data for use in motion compensation relative to a reconstructed reference block from a different frame. Both spatial and motion compensation may be referred to herein as "prediction operations".

The motion compensator 62 locates a reference block within the frame buffer 58 specified for a particular inter-coded macroblock. It does so based on the reference frame information and motion vector specified for the inter-coded macroblock. It then supplies the reference block pixel data for combination with the residual data to arrive at the reconstructed video data for that macroblock.

A deblocking process may then be applied to a reconstructed frame/slice, as indicated by the deblocking processor 60. After deblocking, the frame/slice is output as the decoded video frame 16, for example for display on a display device. It will be understood that the video playback machine, such as a computer, set-top box, DVD or Blu-Ray player, and/or mobile handheld device, may buffer decoded frames in a memory prior to display on an output device. In some instances, other post-processing filter operations may be applied to the pixel domain data before being output.

It is expected that HEVC-compliant encoders and decoders will have many of these same features.

Entropy coding is a fundamental part of all lossless and lossy compression schemes, including the video compression described above. The purpose of entropy coding is to represent a presumably decorrelated signal, often modeled by an independent, but not identically distributed process, as a sequence of bits. The technique used to achieve this must not depend on how the decorrelated signal was generated, but may rely upon relevant probability estimations for each upcoming symbol.

There are two common approaches for entropy coding used in practice: the first one is variable-length coding, which identifies input symbols or input sequences by codewords, and the second one is range (or arithmetic) coding, which encapsulates a sequence of subintervals of the [0, 1) interval, to arrive at a single interval, from which the original sequence can be reconstructed using the probability distributions that defined those intervals. Typically, range coding methods tend to offer better compression, while VLC methods have the potential to be faster. In either case, the symbols of the input sequence are from a finite alphabet.

A special case of entropy coding is when the input alphabet is restricted to binary symbols. Here VLC schemes must group input symbols together to have any potential for compression, but since the probability distribution can change after each bit, efficient code construction is difficult. Accordingly, range encoding is considered to have greater compression due to its greater flexibility, but practical applications are hindered by the higher computational requirements of arithmetic codes.

A common challenge for both of these encoding approaches is that they are inherently serial in nature. In some important practical applications, such as high-quality video decoding, the entropy decoder has to reach very high output speed, which can pose a problem for devices with limited processing power or speed.

One of the techniques used in some entropy coding schemes, such as CAVLC and CABAC, both of which are used in H.264/AVC, is context modeling. With context modeling, each bit of the input sequence has a context, where the context is given by the bits that preceded it. In many cases, the context models may be adaptive, such that the probabilities associated with symbols for a given context may change as further bits of the sequence are processed.

Figure 3:
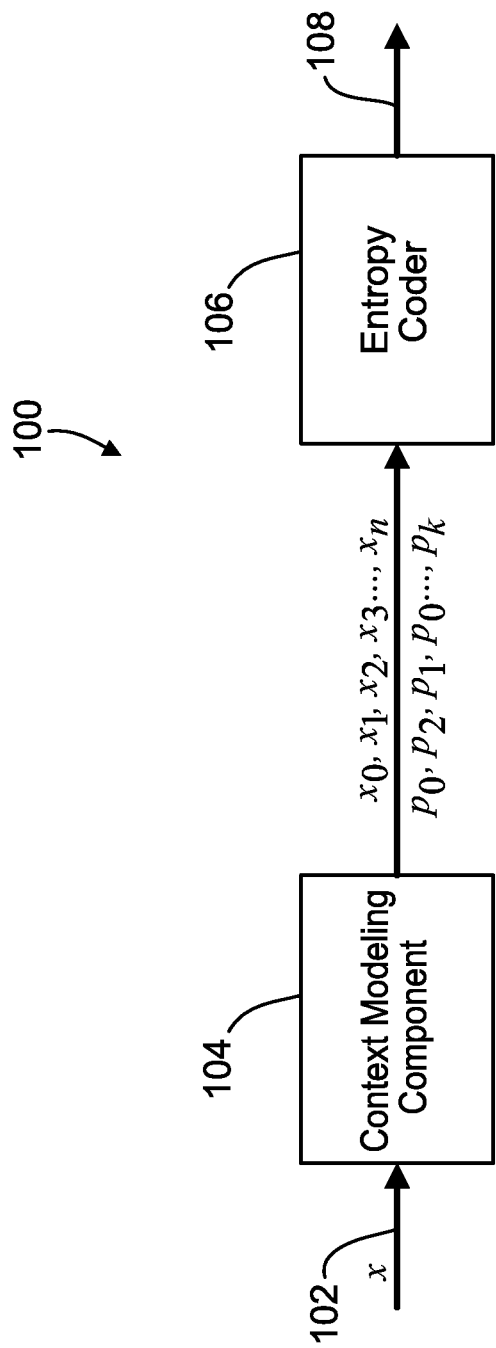
FIG. 3 shows, in block diagram form, an entropy coding process.

Reference is now made to FIG. 3, which shows a block diagram of an encoding process 100. The encoding process 100 includes a context modeling component 104 and an entropy coder 106. The context modeling component 104 receives the input sequence x 102, which in this example is a bit sequence $(x_0, x_1, \ldots, x_n)$. The context modeling component 104 determines a context for each bit $x_i$ based on the context model, and determines a probability $p_i$ associated with that bit $x_i$, where the probability is the probability that the bit will be the Least Probable Symbol (LPS). The LPS may be "0" or "1" in a binary embodiment, depending on the convention or application. The context modeling component outputs the input sequence, i.e. the bits $(x_0, x_1, \ldots, x_n)$ along with their respective probabilities $(p_0, p_1, \ldots, p_n)$. The probabilities are an estimated probability determined by the context model. The context model has a predefined set of probability estimates that it may assign to a bit, e.g. in H.264/AVC there are 64 possible probability estimates. This data is then input to the entropy coder 106, which encodes the input sequence using the probability information. The entropy coder 106 outputs a bitstream 108 of encoded data.

It will be appreciated each bin of the input sequence is processed serially to update the context model, and the serial bits and probability information are supplied to the entropy coder 106, which then serially entropy codes the bins to create the bitstream 108. Those ordinarily skilled in the art will appreciate that, in some embodiments, explicit probability information may not be passed from the context modeling component 104 to the entropy coder 106; rather, in some instances, for each bin the context modeling component 104 may send the entropy coder 106 an index or other indicator that reflects the probability estimation made be the context modeling component 104 based on the context model and the current context of the input sequence 102. The index or other indicator is indicative of the probability estimate associated with its corresponding bin.

In yet another architecture, the entropy coder 106 may be a set of parallel entropy coders; in some cases, one entropy coder for each probability estimate. In such an encoder, the input sequence is parsed by the context modeling component and individual bins are sent to the entropy coder associated with the estimated probability assigned to that individual bin. An example of such an encoder is described in U.S. patent application Ser. No. 12/707,797 filed Feb. 18 ,20010 and owned in common herewith, the contents of which are hereby incorporated by reference. In some cases, there may be fewer entropy coders than there are probability estimates, in which case one or more of the entropy coders processes bins from two or more probability estimates. Various load balancing processes may be used. An example of load balancing in the context of parallel encoding and decoding is described in U.S. patent application Ser. No. 12/758,905 filed Apr. 13, 2010, and owned in common herewith, the contents of which are hereby incorporated by reference.

As described in U.S. patent application Ser. No. 12/707, 797, one process for parallel encoding and decoding is to divide the input sequence into subsequences associated with each respective probability estimate, and to entropy encode the subsequences in parallel to generate a set of encoded subsequences. The encoded subsequences are then concatenated together as a payload preceded by a header, which includes information to enable the decoder to identify the starting point of each of the encoded subsequences in the payload of the bitstream.

It will be appreciated that this process necessitates that the encoder await the end of the input sequence before outputting the resulting bitstream of encoded data, since the entire input sequence needs to be processed before the encoder knows the length of the each of the encoded subsequences and can place such information in the header. In a video context, the input sequence may correspond to a slice, a frame, or a Group-of-Pictures.

This level of delay in outputting the bitstream may introduce problems for real-time video applications, such as video conferencing. Accordingly, it would be advantageous to realize an entropy coding and decoding process that captures as least some of the benefits of parallel processing yet has reduced delay.

One option for reducing delay is to output codewords as they are completed. For example, one encoding process is to output codewords as they are produced/completed from a FIFO buffer, as is described in Ser. No. 12/713,613, filed Feb. 26, 2010, and owned in common herewith, the contents of which are hereby incorporated by reference. However, this process involves serial processing at both the encoder and decoder. For example, at the decoder the codewords of the bitstream are read in order, and each is decoded so as to obtain the decoded bins, update the context model, and thereby determine how to decode the next codeword.

Yet another possible approach, when working with a variable-to-variable length codeset, is to structure the bitstream as a concatenation of "phrases". The term "phrase" as used herein refers to a sequence of bits having a known length. Each phrase is associated with one of the estimated probabilities. All phrases may have the same length, or the length of the phrase may depend on the probability estimate with which it is associated.

In this example process, each phrase starts with a codeword and has a fixed codeword size at least as large as the largest codeword in the codeset. The encoder pads all codewords to the size of the phrase, so decoder knows the starting location of all the phrases. Where there is sufficient room left in the phrase, the padding is supplied by inserting the next codeword having the same associated estimated probability. To the extent that there is insufficient space remaining in the phrase to accommodate the next codeword having the same associated estimated probability, dummy symbols are appended. This technique will be illustrated further below by way of an example. It has the potential to realize some pipelining efficiencies.

Dummy symbols are symbols with default values that will be known to both the encoder and decoder and recognized as dummy symbols. The actual symbols used as dummy symbols may be dependent on the codeset. Care needs to be taken to ensure strings of dummy symbols may be recognized as such by the decoder so that padding bits cannot be misinterpreted as a codeword. The structure of the codeset may determine the most appropriate mechanism for padding the phrase with dummy symbols. In one example embodiment, where the codeword set is a prefix set, it may be possible to use the prefix symbols of the next codeword as padding symbols. For example, if three bits of padding are required to finish a phrase and the next codeword is 011010, the encoder could pad the phrase with the bits 011. These bits would not correspond to a complete codeword in the codeset, so the decoder will recognize that these must be dummy symbols. The complete next codeword 011010 will be at the beginning of the next phrase.

Yet another possible approach to achieve opportunistic parallelism is to use a bitstream architecture of phrases and impose a codeword size as described above, but permit splitting of codewords. That is, the encoder forms phrases of a certain size by padding not with dummy symbols but with the bits of the next codeword having the same associated probability even if the full codeword cannot be accommodated in that phrase. Any unfinished codeword is finished at the start of the next phrase that is associated with that probability. In other words, the encoder is permitted to split codewords across two phrases. Thus, each phrase may not start with a new codeword; some phrases may start with the second part of a split codeword. This approach also permits pipelining in certain circumstances, and will be illustrated further below by way of an example.

In either of these two processes, the decoder receiving the bitstream determines the probability estimate associated with the first phrase using the context model, and begins decoding the codewords of that phrase. Once it has decoded the first codeword in the first phrase to obtain a decoded subsequence of bits, the decoder can update the context model. In some circumstances, the decoder can then determine the probability associated with the next phrase and can begin decoding that phrase, even while still decoding codewords from the first phrase. This opportunistic parallelism is not always possible and depends upon whether the context model ends up pointing to a new probability estimate and, if so, whether there are available any unused previously-decoded bits from an earlier phrase associated with the new probability estimate.

Even more broadly, it would be advantageous to realize a bitstream that contains two or more phrases that are individually accessible and decodable. In the two pipelining processes described above, the decoder must at least begin decoding the first phrase so as to update the context model before it can start decoding the second phrase. It would be desirable to realize a bitstream in which two or more phrases can be decoded in parallel, but without introducing significant delay problems in output from the encoder. Such a bitstream of encoded data can be described using the following structure:

$$A_1B_1 \ldots N_1A_2B_2 \ldots N_2A_3B_3 \ldots N_3 \ldots A_iB_i \ldots N_i \qquad (1)$$

$A_i, B_i, \ldots, N_i$ are binary strings or sequences (referred to herein as phrases). There may be two or more such phrases, i.e. N may be B, C, D, . . . etc. In some cases, N is set based upon the number of known or projected parallel entropy decoders. For example, if it is expected or known that the decoder has four parallel entropy decoders, then the bitstream generated by the encoder may be structured to have sets of four phrases ($A_i, B_i, C_i, D_i$).

The bitstream may be structured by the encoder so as to comply with the following two conditions:

1. The phrases are binary strings whose lengths are known to the decoder, e.g. from the decoded history and/or the available side information.

2. At least part of the phrases $A_i, B_i, \ldots, N_i$ are independently decodable so that the decoding process can continue with reading and processing $A_{i+1}, Bi_{+1} \ldots N_{i+1}$ together with the remaining part of $A_i, B_i \ldots N_i$.

In one embodiment, each phrase contains only codewords or parts of codewords associated with one of the probability estimates. In other words, each phrase is associated with one of the probability estimates.

It should be noted that the second condition provides that at least a part of each phrase is independently decodable. That is, some of the codewords in the phrase(s) may be incomplete, since splitting of codewords across phrases in different sets of phrases is permissible. However, a codeword cannot be split between phrases in the same set. That is, a codeword cannot be partly contained at the end of phrase $A_i$, and finished at the beginning of phrase $B_i$, since $B_i$ would then not be independently decodable from $A_i$.

It will also be appreciated that to realize the second condition, the decoder determines the probability estimate associated with the second and other phrases in the set without needing to update the context model using decoded bits from codewords in the first phrase. That is, the probability estimate associated with the second and other phrases in the set is identifiable by the decoder using information that does not depend on the decoding of the first phrase. The decoder determines the probability estimate associated with the first phrase using the context model. The probability estimates associated with the second and subsequent phrases in the set are then determined based upon a rule. The rule may, in one example implementation, be that all phrases in the set use the same probability estimate. The rule may, in another example implementation, relate the probability estimate associated with the second and subsequent phrases of the set to the probability estimate of the first phrase. For example, where the probability estimates are members of a set of probability estimates $P=\{p_0, p_1, p_2, \ldots, p_N\}$, the rule may indicate that the probability estimate associated with the second phrase is the probability estimate associated with the first phrase plus or minus some offset index. In one example, if the first phrase is associated with probability $p_1$, then the rule may state the second phrase is associated with probability estimate $p_2$, and the third phrase with probability estimate $p_3$, etc. A table or set or logic rules may define the probability estimates of the second and subsequence phrases of a set based upon the probability estimate determined for the first phrase.

It should also be noted that every phrase (with an exception explained below) will terminate at least one codeword, in one embodiment. That is, each phrase will contain at least a complete codeword or the end of a codeword that was split. In this manner, every phrase results in a decodable codeword. Those phrases that contain the end of a split codeword are conceptually concatenated with the previous phrase contain the first portion of the codeword to create a complete codeword. In practical implementations, buffering and indexing is used to ensure the first part of a codeword from one phrase is supplemented with the second part of the codeword from the next phrase associated with the same probability estimate and having the same index in the set, thereby enabling the decoder to entropy decode the complete codeword.

An exception to the above characteristic—that each phrase terminates at least one codeword—arises in the case where a subsequence of codewords is exhausted. If the second or subsequent phrase in a set has an associated probability estimate, but there are no further codewords associated with that probability estimate, then the second or subsequent phrase may contain only dummy symbols.

In another embodiment, codewords may be split across three or even more phrases, which means that in such an embodiment phrases may not terminate at least one codeword.

In some embodiments, the encoder and decoder are also configured to avoid splitting codewords across different indexes. That is, if the first portion of a codeword is contained in $A_i$, then the second portion of the codeword cannot be contained in $B_{i+n}$ but rather is be found in $A_{i+n}$.

The first condition noted above is that the lengths of the phrases are known by the decoder. This condition may be met in a number of implementations. For example, in one embodiment the phrases lengths $L(A_i), L(B_i), \ldots, L(N_i)$ may all be of a fixed predetermined length where $L(A_i)=L(B_i)=L(N_i)$. For example, all phrases may be a predetermined number of bits. This predetermined length may be specified in the header of the bitstream output by the encoder.

In yet another example, all phrases having the same index in the sets, i.e. all $A_i$, or all $B_i$, or all $N_i$, may have a fixed length of $L(A_i), L(B_i), \ldots, L(N_i)$, respectively, where $L(A_i)$ and $L(B_i)$ and $L(N_i)$ are not necessarily equal. Again, in some embodiments, the lengths of the respective phrases may be specified in the header portion of an output bitstream of encoded data.

In yet a further example, a phrase length may be dependent upon the probability estimate associated with that phrase. In an implementation in which the probability estimates of the phrases are the same, then the lengths $L(A_i), L(B_i), \ldots, L(N_i)=L_i$, where $L_i$ is a function of the probability estimate $p_i$. In an implementation in which the probability estimates of the phrases are not necessarily the same, then the lengths of respective phrases are a function of the probability estimates of those respective phrases. That is, length $L(A_i)$ is a function of the probability estimate $p_{A,i}$ associated with phrase $A_i$, and the length $L(B_i)$ is a function of the probability estimate $p_{B,i}$ associated with phrase $B_i$, etc.

Figure 4:
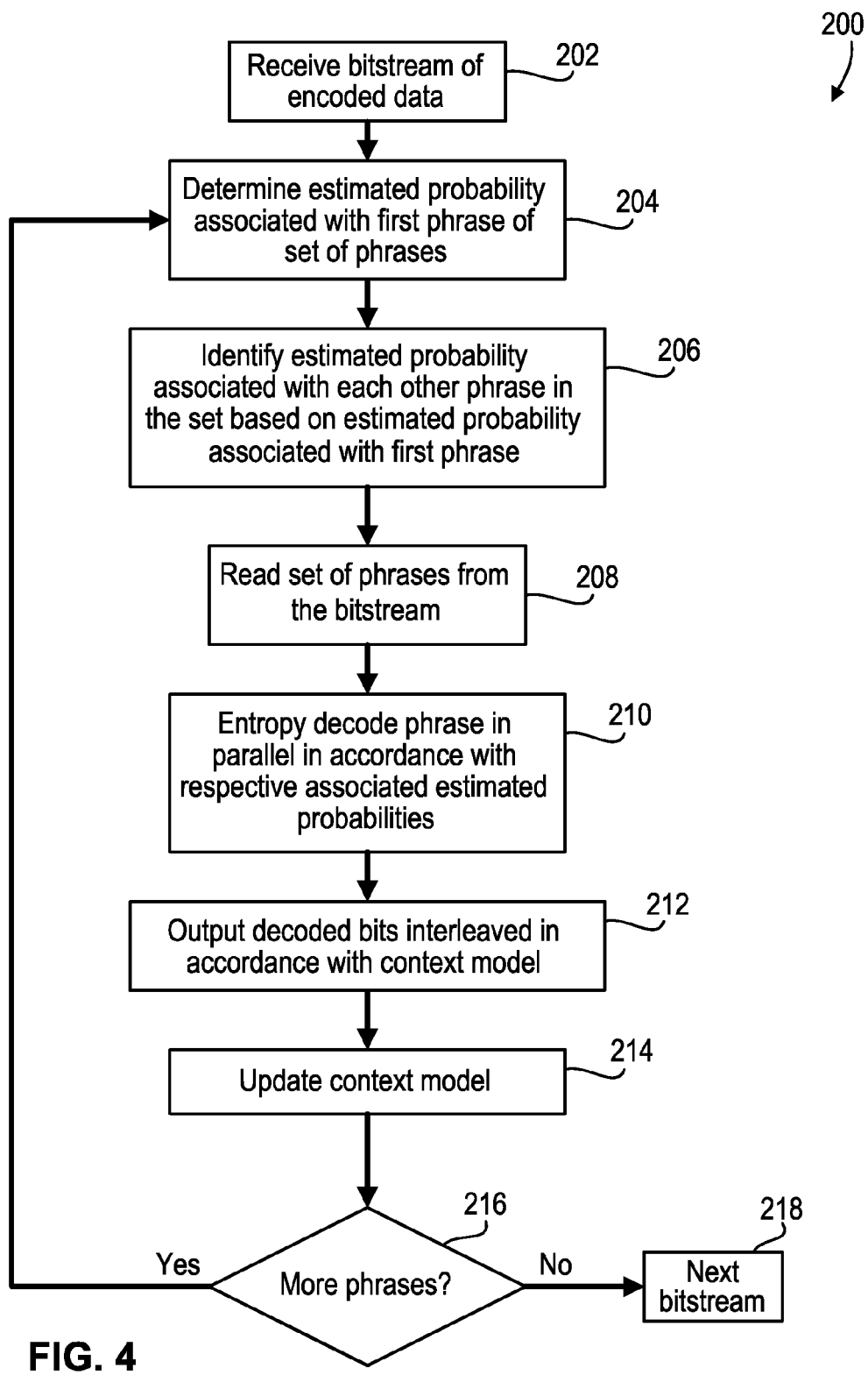
FIG. 4 shows a flowchart illustrating an example decoding process.

Reference is now made to FIG. 4, which illustrates, in flowchart form, an example process 200 for parallel entropy decoding in accordance with the present application. The process 200 may be implemented in any computer or electronic device configured to decoded encoded data. It begins with receiving the bitstream of encoded data in operation 202. This may include reading the encoded data from a computer-readable storage medium, such as a compact disc, DVD, flash memory, etc. In may also include receiving the encoded data through a communication subsystem, such as over an IP connection using wired or wireless networks, or both. In any event, the decoder receives the bitstream of encoded data, and the bitstream is structured as defined above. That is, it may have a header containing side information, such as the phrase length or other parameters, in some embodiments. The payload portion of the bitstream is a concatenation of sets of phrases. There may be two or more phrases in a set. The header may specify the number of phrases and/or their respective lengths. In some embodiments, the lengths may be dependent upon the probability estimate associated with respective phrases. In some embodiments, the header may explicitly or implicitly define the rule or mechanism through which the decoder is to identify the probability estimates associated with the second and subsequent phrases of a set based upon the probability estimates determined to be associated with the first phrase of a set.

In operation 204, the decoder determines the probability estimate associated with the first phrase of a set. This determination is based upon the context model used by both the encoder and decoder. Using this probability estimate, the decoder then identifies the probability estimate associated with the second and any subsequent phrases in the set of phrases in operation 206. As discussed above, in some embodiments, the decoder may be configured to use the same probability estimate as was determined for the first phrase. In other embodiments, the decoder may be configured to associate a different probability estimate with the other phrases, where the probability estimate for those phrases is a function of the probability estimate determined to be associated with the first phrase.

In operation 208, the decoder extracts or reads a set of phrases from the bitstream. In order to read and extract the phrases, the decoder knows the lengths of each of the phrases in bits. In one embodiment, this decoder may know the lengths because all phrases have a fixed equal length L. In another embodiment, the decoder may know the lengths because the first phrases all have a fixed length $L_A$, the second phrases all have a fixed length $L_B$, and so on. In yet other implementation, the phrase length may be a function of the probability estimate associated with the phrase, as determined and identified in operations 204 and 206. The mechanism for determining the lengths of phrases may be communicated to the decoder by the encoder in the header information in some embodiments.

In operation 210, the decoder entropy decodes the extracted/read phrases in parallel using parallel entropy decoders. The decoding of a phrase includes reading the codewords (or parts of codewords) contained therein and converting the (completed) codewords to decoded bins in accordance with the probability estimate associated with the phrase. As will be illustrated below in some instances a phrase may contain a first portion of a codeword but not the complete codeword, in which case the bits of the first portion are buffered until they are completed with bits from the second portion of the codeword found in a phrase from a later set of phrases.

In some cases, the decoder may have fewer parallel decoders than there are phrases in a set. In this case, not all phrases of a set may be decoded in parallel and some scheme of scheduling is implemented; however, at least two of the phrases are decoded in parallel.

Because, in accordance with the foregoing description, the phrases meet the two conditions set out above—they are of a length known to the decoder and at least part of each phrase is independently decodable without reference to the content of any other phrase in the set—the phrases can be entropy decoded in parallel.

The entropy decoding of the phrase results in the output of decoded bins, as indicated by operation 212. The decoder interleaves decoded bins in accordance with its context model to reconstruct the input sequence.

The context model is updated in operation 214. If the bitstream contains further phrases, then operation 216 returns the process to operation 204 to process the next set of phrases. Using the updated context model, the probability estimate of the first phrase of the next set is determined in operation 204, and the process 200 continues.

If the bitstream of encoded data is finished, then from operation 216 the decoder may move to operation 218 by processing the next bitstream, if any. That is, in some implementations each bitstream of encoded data may correspond to a subset of an overall set of data. For example, each bitstream of encoded data may encode a slice, frame, or group-of-pictures, in a video encoding context. In some implementations a single bitstream may encode all the data, in which case operation 218 may exit the process 200.

Figure 5:
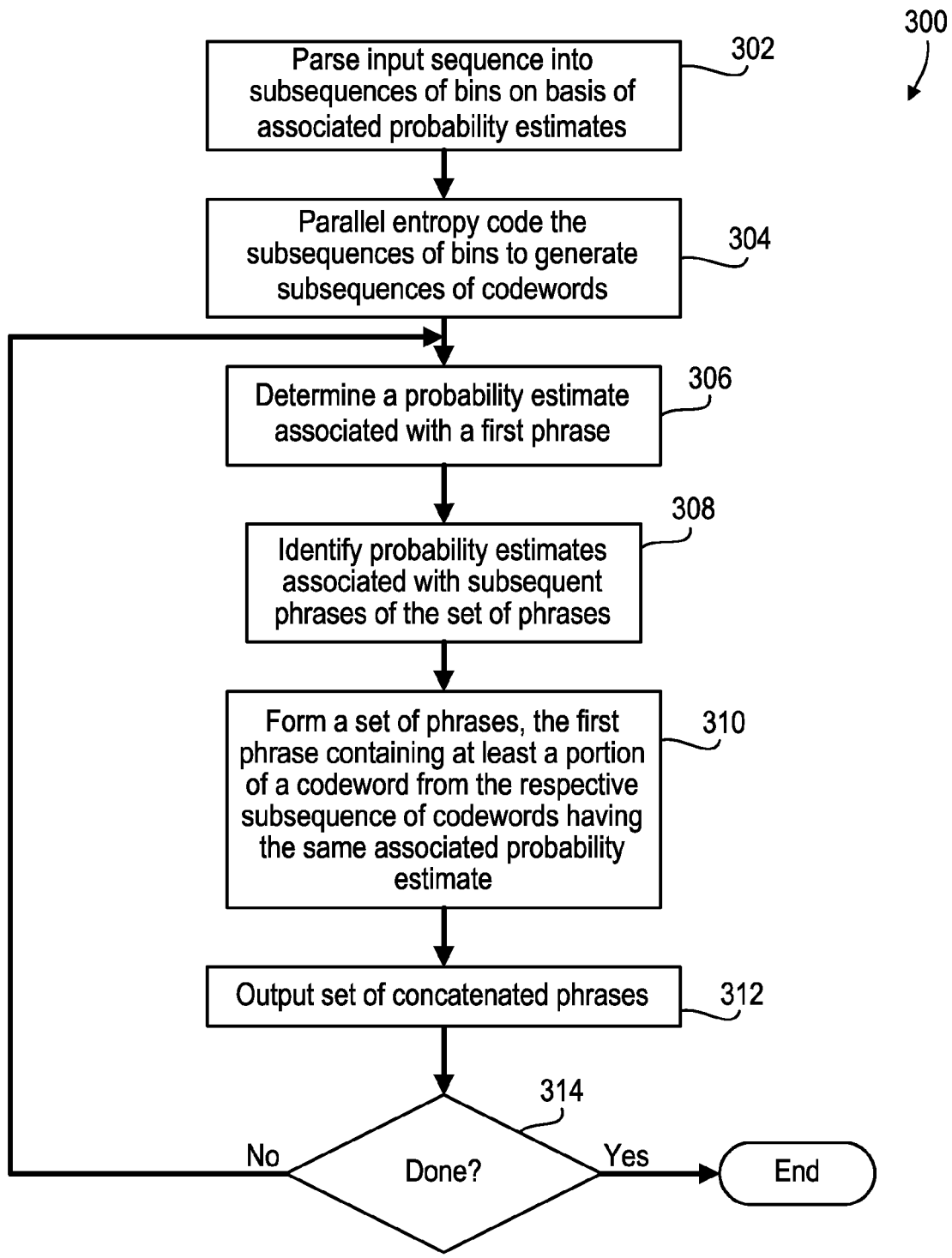
FIG. 5 shows a flowchart illustrating an example encoding process.

Reference is now made to FIG. 5, which shows, in flowchart form, a process 300 for encoding an input bit sequence to produce a bitstream of encoded data in accordance with the present application. The process 300 may be implemented in any computer or electronic device configured to encode data. The input sequence of bits may result from earlier encoding operations. For example, in a video encoding context, the encoder may include other encoding components, such as a coding mode selector, a prediction operation, a transform processor, a quantizer, and a feedback loop and frame store, that serve to generate the input bit sequence.

In operation 302, the encoder parses the input sequence into subsequences of bins on the basis of a context model and probability estimates for each of the bins. That is, each of the subsequences of bins is associated with one of the probability estimates, and bins having that probability estimate are appended to that subsequence. The subsequences are then entropy coded in operation 304 using parallel entropy coders. In some instances, the encoder may have fewer parallel entropy coders than there are subsequences, i.e. probability estimates, in which case some subsequences may be combined and/or some load balancing and scheduling may be used to entropy encode the subsequences. The parallel entropy coders convert the subsequence of bins to a subsequence of codewords. The entropy coders are configured to use a codeset corresponding to the associated probability estimate for that subsequence of bins.

In some embodiments, the encoder may have a choice of two or more codesets for a subsequence, and may be permitted to select one of them for use in encoding the subsequence. The selection may be based upon side information, such as the coding mode or frame type. The codesets may include one that features longer codewords and one that uses shorter codewords. The selection may be based on the expected characteristics of the data based on the side information and may, in some cases, impact the phrase size since the minimum phrase size is related to the length of the longest codeword in the codeset. The selection may be communicated to the decoder as side information, for example within a header.

In operation 306, the encoder determines a probability estimate associated with a first phrase. Initially, this is the probability estimate associated with the first bin of the input sequence. In later iterations, this may be the probability estimate associated with the next bin in the input sequence that has not yet been encoded in a phrase, or that has only been partially encoded in an earlier phrase because of a split codeword.

In operation 308, having determined the probability estimate associated with the first phrase in the set, the encoder identifies the probability estimate associated with each of the other phrases in the set. As noted above in connection with FIG. 4, the probability estimates of the other phrases are not dependent upon the content of the first phrase or its decoded bits; rather, the probability estimates of the other phrases are determined based upon the probability estimate of the first phrase.

The encoder then forms the set of phrases in operation 310. This includes adding to each phrase codewords, or portions of codewords, from the subsequence of codewords having the same associated probability estimate. In one example, if the first phrase is a associated with a first probability estimate, then the first phrase is formed by selecting codewords from the subsequence of codewords associated with the first probability estimate.

In some embodiments, the phrases each have a length longer than the length of the longest codeword in the codeset applicable to that phrase. In some embodiments, the phrase may be twice the length of the longest codeword. However, in some embodiments the phrases may be shorter than the length of the longest codeword applicable to that phrase.

Once a codeword is added to the phrase associated with the first probability estimate, some space likely remains in the phrase. Accordingly, the encoder adds the next codeword from the subsequence of codewords associated with the probability estimate. This continues until the length of the phrase is reached. If a codeword cannot entirely fit at the end of the phrase, then the codeword is split such that the first part of the codeword appears at the end of the phrase, and the second part of the codeword is saved and placed at the beginning of the next phrase associated with that same estimated probability in a subsequence set of phrases. It will be appreciated from the foregoing description that, in some other embodiments, splitting of codewords across phrases may not be permitted.

It will be understood that in operation 310 if a given phrase is associated with a given probability estimate, and in forming a previous set of phrases a codeword from the subsequence of codewords associate with that given probability estimate was only partially used, then the given phrase starts with the second part of the partially used codeword, thereby completing it.

After step 310, the set of concatenated phrases is output in operation 312. If further codewords remain in the subsequence of codewords, as indicated in operation 314, then the process 300 returns to operation 306 to being forming the next set of phrases.

It will be understood that the parallel entropy coding of the subsequences in operation 304 and the formation of the bitstream as sets of concatenated phrases in operations 306-312 may be performed simultaneously in a pipelined implementation. In other words, operation 304 need not be completely finished before operations 306-312 are started.

Figure 6:
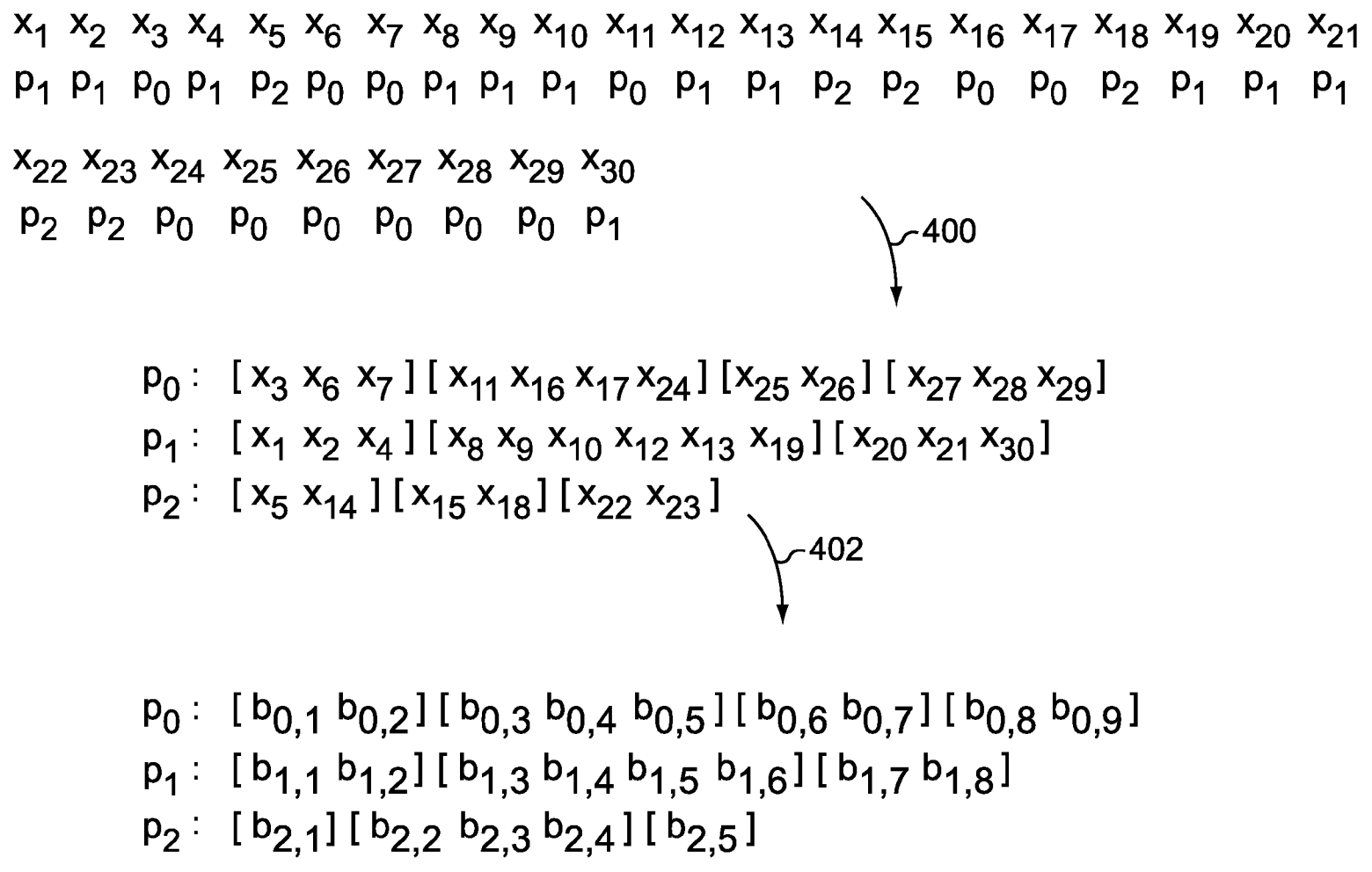

Examples of the encoding and decoding processes discussed herein will now be illustrated by way of an example input sequence. Reference is now made to FIG. 6, which shows an example input sequence of bins $(x_1, x_2, \ldots, x_{30})$. In this simplified example, assume a bitstream of only thirty bins, and a context model having only three probabilities: $p_0$, $p_1$, and $p_2$. Based on the context model, the probability estimate associated with each of the bins $x_1 \ldots x_{30}$ is shown in FIG. 6.

The parsing of the bins $x_i$, into subsequences of bins on the basis of probability estimate is also illustrated in FIG. 6, as indicated by the arrow labeled 400. FIG. 6 further shows the codewords (each codeword being formed from bits $b_i$) that correspond to encoding of the subsequences of bins in accordance with their respective probability estimates, as indicated by arrow 402. The square brackets [ ] around the bins in the subsequences indicate those portions of the subsequence that result in a completed codeword using the applicable codeset for that probability estimate. The corresponding codewords are also delimited using square brackets [ ]. For example, the four bin sequence $[x_{11} x_{16} x_{17} x_{24}]$ is encoded by the three bit codeword $[b_{0,3} b_{0,4} b_{0,5}]$.

Figure 7:
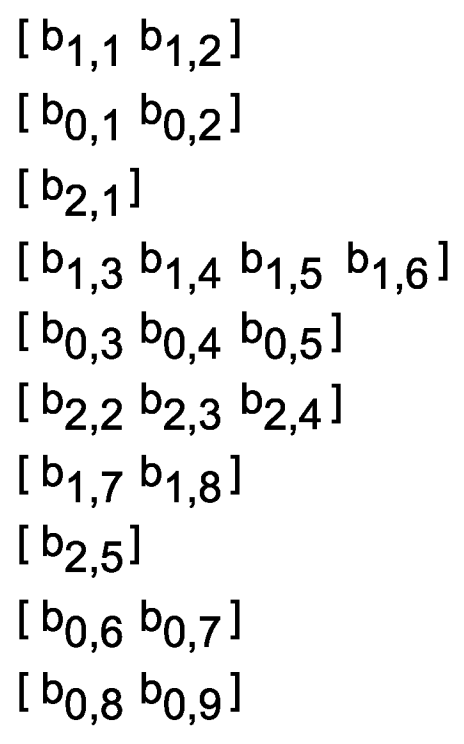

As described above, one possible mechanism for structuring the bitstream of codewords is to output the codewords from a FIFO buffer on the basis of the context model. FIG. 7 shows the resulting bitstream of concatenated codewords (listed vertically for ease of illustration). It will be noted that the codewords are output in the order in which their decoded bits are required to reconstruct the input sequence. Accordingly, the first codeword output is $[b_{1,1} b_{1,2}]$ since it supplies $x_1$ and $x_2$. After $x_2$, the context model specifies that the next bin is associated with probability $p_0$; thus, the next codeword output is $[b_{0,1} b_{0,2}]$, which can be decoded to supply $[x_3 x_6 x_7]$.

As noted previously, to decode the bitstream, a decoder entropy decodes the first codeword to recover $[x_1 x_2 x_4]$. Using the context model, the decoder recognizes that the first bit is to be associated with probability estimate $p_1$. Accordingly, the first bit in the reconstructed sequence, $x_1$, is taken from the first decoded codeword, which is thus known to be associated with probability estimate $p_1$. The context model is updated and the decoder recognizes that the next bit is also associated with probability estimate $p_1$. Thus the next bit in the reconstructed sequence is drawn from the as-yet-unused bits of the decoded codewords associated with probability estimate $p_1$, meaning that $x_2$ is added as the next bit of the reconstructed sequence. The context model is again updated and reveals that the next bit in the sequence is associated with probability estimate $p_0$. Therefore, since there are no decoded bits currently associated with probability estimate $p_0$, the decoder reads the next bits of the bitstream to find a codeword from the codeset associated with probability estimate $p_0$. Thus it reads $[b_{0,1} b_{0,2}]$ and decodes this codeword to recover $[x_3 x_6 x_7]$, and the bit $x_3$ is added to the reconstructed sequence. It will be appreciated that this process involves significant serial decoding and context modeling.

Reference is now made to FIG. 8, which shows an example bitstream resulting from use of a structure having phrases of fixed length; in this case, 4 bits. In this example, each phrase may have more than one codeword, but codewords are maintained whole—i.e. not split between phrases. Each phrase is associated with a probability estimate, meaning that if it contains more than one codeword, all codewords in the phrase are associated with the same probability estimate. If the next codeword is too long to fit in the remaining bits of a phrase, then the phrase is padded with dummy symbols. In the examples illustrated herein the symbol # is used to indicate a dummy symbol.

It will be noted that this process results in a bitstream that includes a number of dummy symbols throughout the bitstream. The extent to which dummy symbols must be used is dependent upon the size of the phrases and the codewords.

Reference is now made to FIG. 9, which shows another example bitstream resulting from use of a structure in which the phrases are fixed length, but codewords are permitted to split across phrases. Accordingly, in the first phrase, the last two bits are filled with the first part of the next codeword associated with probability estimate $p_1$:$[b_{1,3} b_{1,4}$. This codeword is later completed in phrase four. After encoding the first codeword and padding the remainder of the first phrase with bits from the next codeword having the same probability estimate, the encoder determines, using an updated context model, the codeword that is next required by the decoder to reconstruct the sequence. In this case, it is a codeword associated with probability estimate $p_0$, meaning that the second phrase starts with a codeword associated with that probability estimate. The encoder again pads the remaining two bits of the phrase with the incomplete first portion of the next codeword associated with probability estimate $p_0$. It is only at phrase four that the context model specifies that probability estimate $p_1$ is again required, since by this point the decoder will be looking for bin $x_8$. The encoder recognizes that the first portion of the next codeword for probability estimate $p_1$ has been partly placed at the end of the first phrase. Accordingly, it completes the codeword by placing bits $b_{1,5} b_{1,6}]$ at the beginning of the fourth phrase.

In this manner, the encoder avoids using any dummy symbols until the end of the bitstream as the subsequences of codewords for each probability estimate are exhausted.

Although the examples illustrated in FIGS. 8 and 9 use 4 bit phrases, it will be understood that longer or shorter phrases may be used, provided the phrases are at least as long as the longest codeword. It will also be noted that each phrase terminates at least one codeword. That is, every phrase contains the last bit of at least one codeword.

It will be appreciated from the examples illustrated in FIGS. 8 and 9 that the phrases in this example are not independent. That is, the second phrase cannot be decoded until the first codeword of the first phrase is decoded and the context model is updated using one or more of the decoded bits, so that the decoder knows what probability estimate is associated with second phrase. Nevertheless, with phrases that are sufficiently long some pipelining advantages can be achieved. For example, if the first codeword is decoded from the first phrase and the updated context model resulting from the decoded bits provides the probability estimate associated with the second phrase, the decoder may continue decoding the subsequence codewords of the first phrase while simultaneously starting the decoding of the codewords in the second phrase. It will be appreciated that this pipeline-based parallelism is opportunistic in that it contextually depends on how quickly the context model indicates a need for a different probability estimate, and whether there are available any already decoded but unused bits from codewords in previous phrases for that different probability estimate. It will also be appreciated that there are some context-based sequence reordering techniques that may be employed to render phrases independent. Examples of such techniques are described and disclosed in U.S. provisional patent application Ser. Nos. 61/325,806 and 61/363,717, filed Apr. 19, 2010 and Jul. 13, 2010, respectively, and owned in common herewith. The contents of those two applications are incorporated herein by reference.

Reference is now made to FIG. 10, which illustrates the application of the parallel encoding process described in connection with FIG. 6 to the example sequence detailed in FIG. 7. For the purposes of this simplified example illustration, the set of phrases is presumed to contain two phrases: A and B. It is also presumed for this example that the phrase lengths $L(A_i)$ and $L(B_i)$ are equal, and are four bits in length. As noted above, the probability estimate of the second phrase is dependent upon the probability estimate determined for the first phrase. In this example illustration, it is presumed that the probability estimate used for the second phrase is identical to the probability estimate determined for the first phrase.

The encoder forms the set of phrases by first determining from the context model the probability estimate with which to begin. Accordingly, the first phrase $A_1$ is associated with probability estimate $p_1$. Thus, the second phrase $B_1$ is also associated with the same probability estimate. The first phrase A1 is therefore formed from codeword $[b_{1,1}\ b_{1,2}]$ and the first portion of the next codeword having that probability estimate: $[b_{1,3}\ b_{1,4}$. The second phrase, $B_1$, cannot contain the remainder of the incomplete codeword because it must be independently decodable. Accordingly, it starts with the next codeword associated with probability estimate $p_1$, which is $[b_{1,7}\ b_{1,8}]$. Because in this simplified example using a short sequence there are no further codewords associated with this probability estimate, phrase $B_1$ is then padded with dummy symbols.

The next set is formed by determining, from the context model, the probability estimate associated with the next phrase. In this case, the decoder will next require a bin associated with probability estimate $p_0$. Accordingly phrases $A_2$ and $B_2$ are associated with probability estimate $p_0$. As indicated, the phrases are formed using the codewords from the subsequence of codewords associated with probability estimate $p_0$.

The third set is then formed by determining, from the context model, the next required probability estimate, which is probability estimate $p_2$. The context model then indicate the next probability estimate required is probability estimate $p_1$, on the basis that bin $x_8$ is associated with probability estimate $p_1$. The codeword for bin $x_8$ was partially encoded in phrase $A_1$; however, it is unfinished. Accordingly, in phrase $A_4$, the codeword is finished by including bits $b_{1,5}\ b_{1,6}]$. As all other codewords associated with probability estimate $p_1$ were already placed in phrase $B_1$, no further codewords are available for phrases $A_4$ and $B_4$, and dummy symbols fill the remainder of them. The context model will next determine a need for bins associated with probability estimate $p_0$ (in particular, $x_{11}$ . . . ), which will lead the encoder to finish the partial codeword from the end of $A_2$ by adding bit $b_{0,5}$ to phrase $A_5$. As all other codewords have been placed in earlier phrases, no further sets are generated. The sets are output as concatenated phrases to form the bitstream of encoded data.

It will be noted that dummy symbols are not required until the sequences of codewords are exhausted. In this simplified example of short sequences, this occurs fairly early; however, in practical applications the sequences of codewords are likely to be much longer and thus result in many sets of phrases containing no dummy symbols until near the end of the bitstream.

Another example implementation for this sample sequence is illustrated in FIG. 11. The difference in FIG. 11 is that instead of the probability estimate of phrase $B_i$ being identical to the probability estimate determined for phrase $A_i$, it is mapped differently. In particular, the following mapping is used:

$p_A \neq p_B$
$p_{1,A} \rightarrow p_{2,B}$
$p_{2,A} \rightarrow p_{0,B}$
$p_{0,A} \rightarrow p_{1,B}$ For example, if the probability estimate for phrase A is $p_0$, then the probability estimate for phrase B is $p_1$, and so on. The resulting sets of phrases are detailed in FIG. 11.

Figure 12:
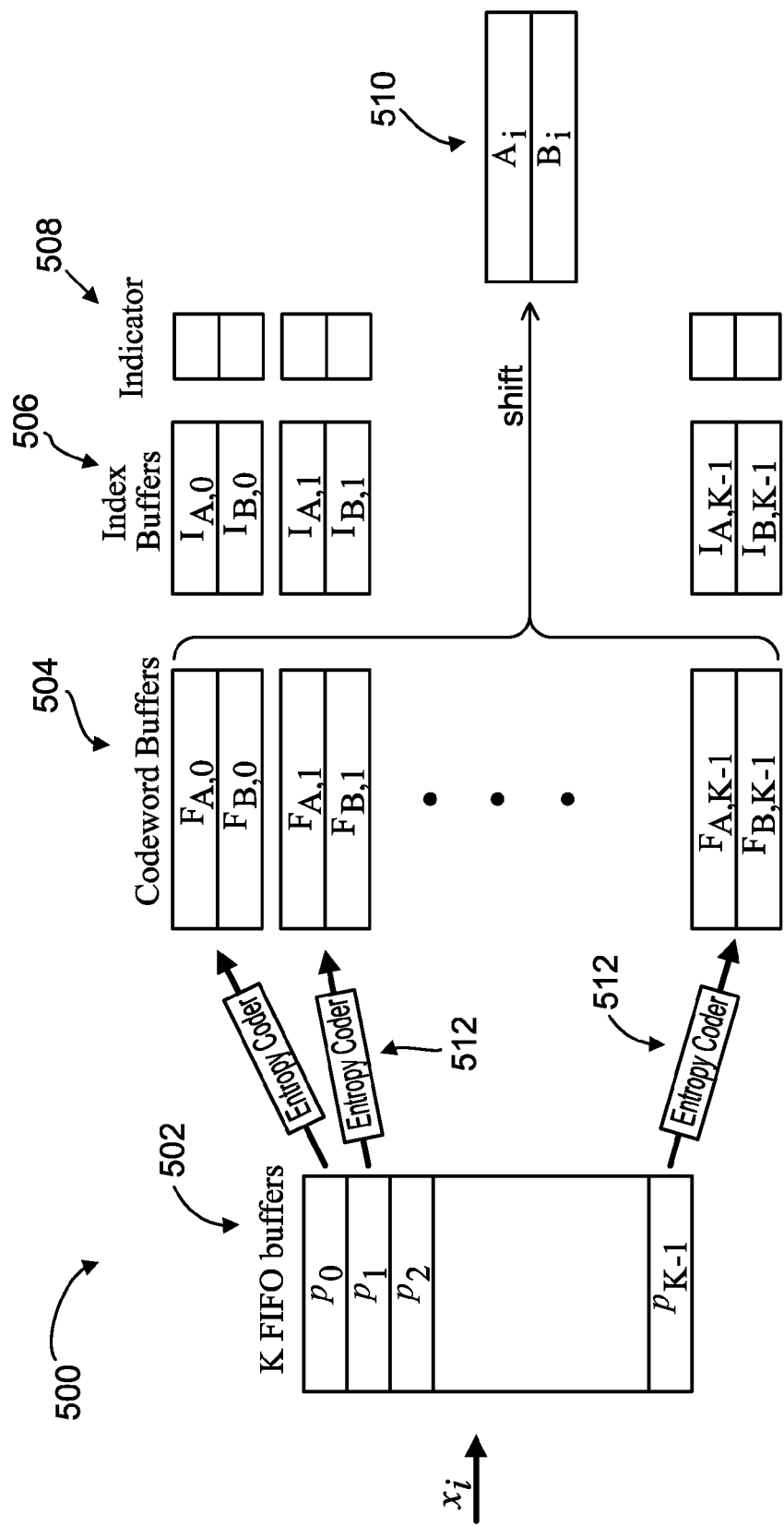
FIG. 12 diagrammatically illustrates an example process for encoding an input sequence.

Reference is now made to FIG. 12, which diagrammatically shows an example process 500 for encoding an input sequence to produce a bitstream containing sets of phrases that may be entropy decoded in parallel.

The process 500 includes a set of K FIFO buffers 502 for containing the subsequences of bins. The bins of the input sequence x are allocated amongst the FIFO buffers, where each buffer is associated with one of the estimated probabilities $p_k$. There are K possible probability estimates. That is, $p_k = \{p_0, p_1, \ldots, p_{K-1}\}$.

The process 500 further includes allocating two associated FIFO codewords buffers to each FIFO subsequence of bins buffer. This example presumes two phrases in a set and that the two phrases have the same associated probability. In other words $A_i$ and $B_i$ with $L(A_i)=L(B_i)$ and $p_A=p_B$. Each probability estimates thus has a pair of associated codeword buffers 504, indicated as $F_{A,k}$ and $F_{B,k}$. Each of the codeword buffers is allocated an associated index buffer 506, $I_{A,k}$ and $I_{B,k}$.

The codeword buffers in this example implementation have a length of twice the maximum length ($l_{max,k}$) of the longest codeword in the codeset used for the associated probability estimate $p_k$. Each of the codeword buffers may also have an indicator 508, which may in this example be a one-bit flag initialized to zero.

The subsequences of bins in the FIFO buffers 502 are encoded by entropy encoders 512 to produce codewords that are placed in the corresponding codeword buffers 504. The index buffers 506 may be used ensure the codewords are output in the correct order. The index buffers 506 may be used to record the index (bit position in the input sequence) of the first bin symbol mapped to a codeword placed in the corresponding codeword buffer 504.

The indicator field or flag 508 is used to indicate when the pair of codeword buffers both contain $L_k$ or more bits, where $L_k$ is the phrase length for that probability estimate. Once the indicator is set to 1, it indicates that the corresponding codeword buffer 504 is ready to form a set of phrases 510. The index buffer is compared to other index buffers to determine which codeword buffers 504 should be shifted out first to form the next set of phrases 510.

One example of an encoder operation using the process 500 of FIG. 11 is as follows:

---

Operation 1: Set i = 1;
Operation 2: All buffers are initialized empty, and the indicator is set to 0. For bin buffer i, the length of the two associated codeword buffers is at least twice of the longest codeword length ($l_{max, k}$) of the variable-to-variable (V2V) code for $p_k$.
    Operation 3: For k = 0, 1, . . . , K − 1, do the following:
        Operation 3a: Use V2V code for $p_k$ to encode the remaining bin symbols in the buffer.
        Operation 3b: If a complete codeword is reached,
            send the codeword to the first codeword buffer $F_{A, k}$ and record the index of the first bin symbol mapped to the codeword in $I_{A, k}$ if the number of bits in $F_{A, k}$ is less than $L_k$ ($L_k \geq l_{max, k}$)
            or, if the number of bits in $F_{A, k}$ is equal to or greater than $L_k$, then send the codeword to the second codeword buffer $F_{B, k}$ and record the index of the first bin symbol mapped to the codeword in $I_{B, k}$ if the number of bits in $F_{B, k}$ is less than $L_k$.
        Operation 3c: If $F_{A, k}$ and $F_{B, k}$ both contain more than $L_k$ bits each, set the indicator to 1.
        Operation 3d: If the indicator is set to 1, and the first entry of $I_{A, k}$ or the first entry of $I_{B, k}$ is the smallest among all $\{I_{A, i}, I_{B, 1}, \ldots, I_{A, K-1}, I_{B, K-1}\}$, do the following:
            Operation 3d.1 Shift out the first $L_k$ bits of $F_{A, k}$ as $A_i$, and shift out the first $L_k$ bits of $F_{B, k}$ as $B_i$;
            Operation 3d.2 Shift out $t_A$ entries from $I_{A, k}$ and $t_B$ entries from $I_{B, k}$, where $t_A$ denotes the number of codewords terminating in $A_i$, and $t_B$ denotes the number of codewords terminating in $B_i$.
            Operation 3d.3 Set the indicator to 0.
            Operation 3d.4 Increase i by 1.
    Operation 4: Repeat Operation 3 until x is processed.
    Operation 5: After x is processed, for k = 0, 1, . . . , K − 1, flush out the remaining incomplete codewords in the codeword buffers by appending the MPS (most probable symbol) symbols to the bin buffers, and if necessary append default bits (e.g. bit 0) so that the indicator is set to 1 in Operation 3c. The order of output is determined again by the index buffers.

---

It will be appreciated from the foregoing description that in Operation 3 of the above example process, instead of using a single $L_k$, different length parameters $L_{A,k}$ and $L_{B,k}$ may be used, where both are no smaller than $l_{max,k}$, for $F_{A,k}$ and $F_{B,k}$, respectively.

Note that in some embodiments, one may want to impose a buffer length threshold on $F_{A,k}$ and $F_{B,k}$ so that crossing it may trigger a flush event to flush out the incomplete codewords in the codeword buffers by using a mechanism similar to that described in Operation 5, above.

It will also be appreciated that the foregoing process does not describe the parsing of the input sequence into the FIFO buffers 502. It will be appreciated that the parsing may be implemented in pipeline with the coding process described above to realize an efficient implementation.

In the foregoing description, at times it has been assumed that V2V codes are used as the entropy coding method; however it should be noted that the described encoding and decoding process can work with other entropy coding methods like Huffman coding, Tunstall coding, and arithmetic coding. In the case of binary arithmetic coding as specified in H.264 AVC, the minimum length of a decodable string in the bitstream, e.g., $L(A_i)$ is the smallest number of bits required to decode at least one bin symbol for the probability associated with $A_i$. Furthermore, the bitstream format above exhibits a behaviour similar to that of variable-length-to-fixed-length codes like Tunstall codes. However, by relaxing the constraint of using strict Tunstall coding, it becomes possible to find a good tradeoff among compression efficiency, delay, and decoding throughput.

In one sense, the bitstream of encoded data generated by the encoder and received and decoded by the decoder may be viewed as a two-dimensional matrix of phrases having this structure:

[s(1, 1), idx(1, 1)] [s(1, 2), idx(1, 2)] . . .
[s(2, 1), idx(2, 1)] [s(2, 2), idx(2, 2)] . . .
[s(3, 1), idx(3, 1)] [s(3, 2), idx(3, 2)] . . .

In this structure, s( ) is a phrase, and idx denotes an index (in a probability or a codeset). Each column represents an ordered set of phrases (in this case three), which are output in sequence, i.e. the encoder outputs the bitstream s(1,1)s(2,1)s (3,1)s(1,2)s(2,2)s(3,2). . . . Each row in this structure contains phrases in the same "position" or having the same "index" in the set. In other words, using the notation $A_i$, $B_i$, $C_i$, the first row is all the $A_i$ phrases, the second is all the $B_i$ phrases, and the third row is all the $C_i$ phrases.

It will be appreciated conceptually that the idx parameter may be used to track phrases having the same associated probability estimate. Accordingly, if the phrases of the same row and having the same idx (associated probability estimate) are concatenated, one obtains a sequence of complete codewords.

Figure 13:
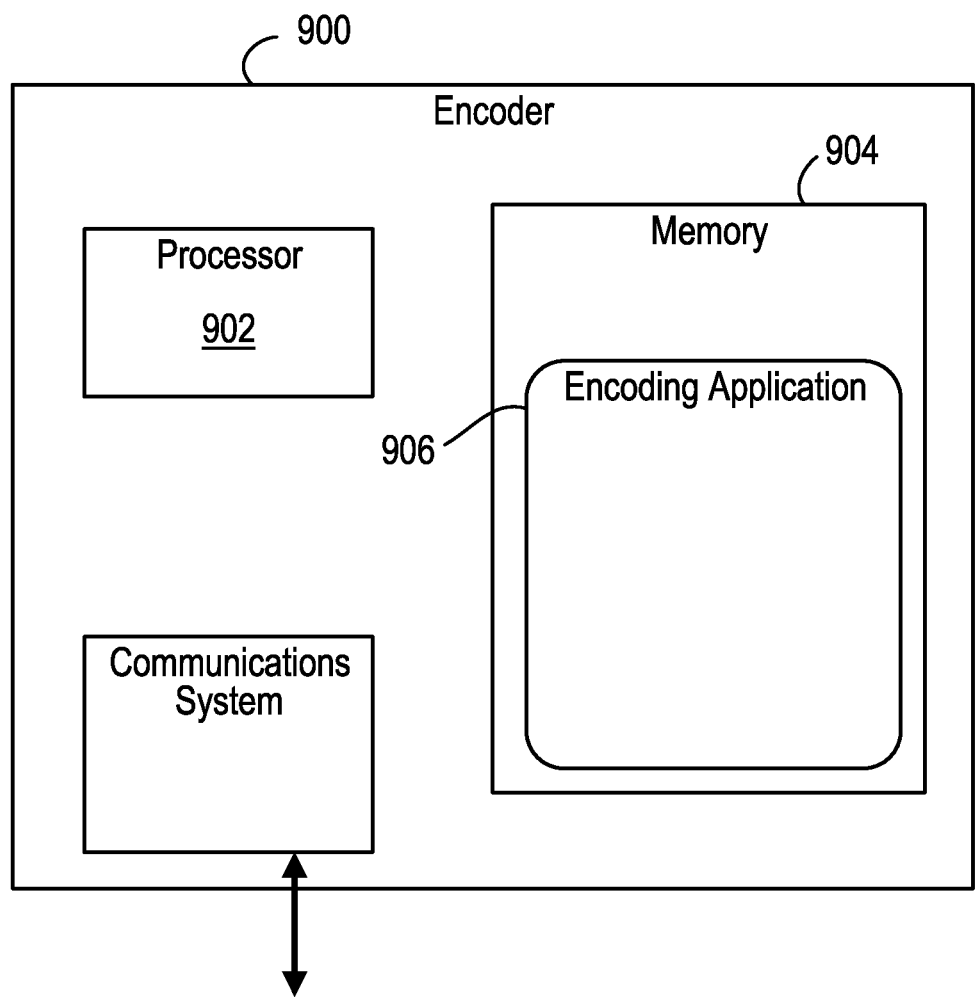
FIG. 13 shows a simplified block diagram of an example embodiment of an encoder.

Reference is now made to FIG. 13, which shows a simplified block diagram of an example embodiment of an encoder 900. The encoder 900 includes a processor 902, memory 904, and an encoding application 906. The encoding application 906 may include a computer program or application stored in memory 904 and containing instructions for configuring the processor 902 to perform steps or operations such as those described herein. For example, the encoding application 906 may encode and output bitstreams encoded in accordance with the processes described herein. The input data points may relate to audio, images, video, or other data that may be subject of a lossy data compression scheme. The encoding application 906 may include parallel entropy encoders configured to entropy encode and other data as part of the bitstream. It will be understood that the encoding application 906 may be stored in on a computer readable medium, such as a compact disc, flash memory device, random access memory, hard drive, etc.

Figure 14:
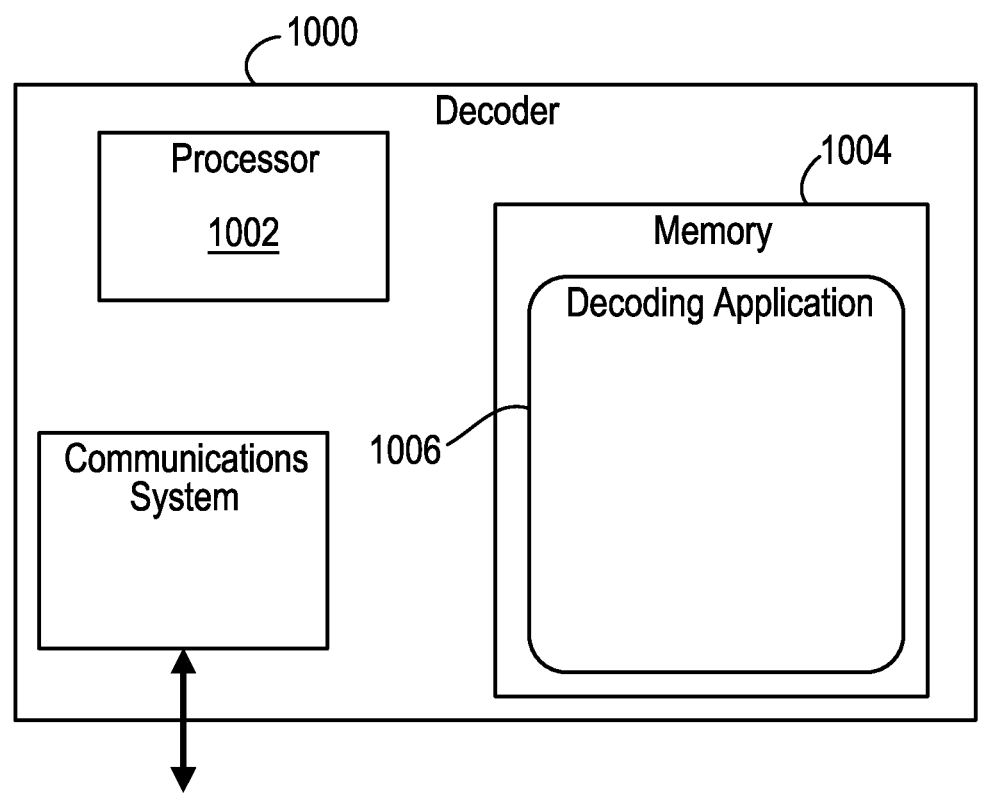
FIG. 14 shows a simplified block diagram of an example embodiment of a decoder.

Reference is now also made to FIG. 14, which shows a simplified block diagram of an example embodiment of a decoder 1000. The decoder 1000 includes a processor 1002, a memory 1004, and a decoding application 1006. The decoding application 1006 may include a computer program or application stored in memory 1004 and containing instructions for configuring the processor 1002 to perform steps or operations such as those described herein. The decoding application 1006 may include parallel entropy decoders. It will be understood that the decoding application 1006 may be stored in on a computer readable medium, such as a compact disc, flash memory device, random access memory, hard drive, etc.

It will be appreciated that the decoder and/or encoder according to the present application may be implemented in a number of computing devices, including, without limitation, servers, suitably programmed general purpose computers, audio/video encoding and playback devices, set-top television boxes, television broadcast equipment, and mobile devices. The decoder or encoder may be implemented by way of software containing instructions for configuring a processor to carry out the functions described herein. The software instructions may be stored on any suitable non-transitory computer-readable memory, including CDs, RAM, ROM, Flash memory, etc.

It will be understood that the encoder described herein and the module, routine, process, thread, or other software component implementing the described method/process for configuring the encoder may be realized using standard computer programming techniques and languages. The present application is not limited to particular processors, computer languages, computer programming conventions, data structures, other such implementation details. The described processes may be implemented as a part of computer-executable code stored in volatile or non-volatile memory, as part of an application-specific integrated chip (ASIC), etc.

Certain adaptations and modifications of the described embodiments can be made. Therefore, the above discussed embodiments are considered to be illustrative and not restrictive.

What is claimed is:

1. A method for encoding an input sequence of bins, using a computing device, to produce encoded data, the method comprising:
   parsing, with the computing device, the input sequence into subsequences of bins, each subsequence of bins being associated with a respective one of a predefined number of probability estimates;
   arithmetically encoding, with the computing device, the subsequences of bins to generate subsequences of strings, wherein each subsequence of strings is associated with the respective one of the predefined number of probability estimates associated with the corresponding subsequence of bins; and
   interleaving, using the computing device, the subsequences of strings to form an encoded sequence by
      determining from a context model a first probability estimate,
      forming an ordered set of phrases, the first phrase in the set containing at least a portion of a string from the subsequence of strings associated with the first probability estimate, each of the remaining phrases containing at least a portion of a string from the subsequence of strings associated with a respective probability estimate, wherein the respective probability estimate is identified based on the first probability estimate, and
      repeating the determining and the forming until all the strings from the subsequences of strings are interleaved into sets of phrases,
   wherein the encoded sequence comprises a concatenation of the sets of phrases, and wherein the respective probability estimates associated with each of the other phrases are identified without dependence upon the subsequence of bins encoded as the strings of the first of the phrases.

2. The method claimed in claim 1, wherein at least one of the respective probability estimates associated with one of the other phrases is identified by the probability estimate of the first phrase plus an offset.

3. The method claimed in claim 1, wherein one of the phrases in one set of phrases ends with a first portion of a split string, and wherein a phrase in a subsequent set of phrases in the encoded sequence starts with a second portion of the split string.

4. The method claimed in claim 1, wherein forming includes forming each phrase to have a respective predetermined length.

5. The method claimed in claim 4, wherein the respective predetermined length of each phrase is dependent upon that phrase's associated probability estimate.

6. A method of decoding an encoded sequence, using a computing device, to obtain decoded data, the encoded sequence having been encoded in accordance with a context model using arithmetic coding, the method comprising:
   reading an ordered set of two or more consecutive phrases from the encoded sequence, a first of the phrases in the set containing at least part of one string of arithmetically-encoded data, wherein the phrases have a respective predetermined length;
   determining, with the computing device, from the context model a probability estimate associated with the first of the phrases;
   identifying, with the computing device, from the probability estimate of the first phrase, respective probability estimates associated with each of the other phrases in the set;
   arithmetically decoding, using the computing device, at least a portion of each of the two or more phrases of the set in parallel in accordance with their respective associated probability estimates to create decoded phrase bits; and
   updating, using the computing device, the context model based upon at least some of the decoded phrase bits,
   wherein the respective probability estimates associated with each of the other phrases are determined without dependence upon decoding of the first of the phrases.

7. The method claimed in claim 6, wherein at least one of the respective probability estimates associated with one of the other phrases is identified by the probability estimate of the first phrase plus an offset.

8. A non-transitory computer-readable medium storing computer-executable instructions which, when executed by a processor, configure the processor to perform the method claimed in claim 7.

9. The method claimed in claim 6, wherein one of the phrases in one set of phrases ends with a first portion of a split string, and wherein a phrase in a subsequent set of phrases in the encoded sequence starts with a second portion of the split string.

10. The method claimed in claim 9, further comprising repeating the reading, determining, identifying, arithmetically decoding and updating for the subsequent set of phrases, and further comprising buffering the first portion of the split string, appending the second portion of the split string to the first portion of the split string to form a completed string, and arithmetically decoding the completed string.

11. The method claimed in claim 6, wherein the respective predetermined length of each phrase is dependent upon that phrase's associated probability estimate.

12. The method claimed in claim 6, further comprising repeating the reading, determining, identifying, entropy decoding and updating for each ordered set of phrases from the encoded sequence until the encoded sequence is decoded.

13. An encoder for encoding an input sequence of bins, the encoder comprising:
- a processor;
- a memory; and
- an encoding application stored in memory and containing instructions for causing the processor to
    - parse the input sequence into subsequences of bins, each subsequence being associated with a respective one of a predefined number of probability estimates,
    - arithmetically encode the subsequences of bins to generate subsequences of strings, wherein each subsequence of strings is associated with the respective one of the predefined number of probability estimates associated with the corresponding subsequence of bins, and
    - interleave the subsequences of strings to form an encoded sequence by determining from a context model a first probability estimate,
        - forming an ordered set of phrases, the first phrase in the set containing at least a portion of a string from the subsequence of strings associated with the first probability estimate, each of the remaining phrases containing at least a portion of a string from the subsequence of strings associated with a respective probability estimate, wherein the respective probability estimate is identified based on the first probability estimate, and
        - repeating the determining and the forming until all the strings from the subsequences of strings are interleaved into sets of phrases,
    - wherein the encoded sequence comprises a concatenation of the sets of phrases, and wherein the respective probability estimates associated with each of the other phrases are identified without dependence upon the subsequence of bins encoded as the strings of the first of the phrases.

14. The encoder claimed in claim 13, wherein one of the phrases in one set of phrases ends with a first portion of a split string, and wherein a phrase in a subsequent set of phrases in the encoded sequence starts with a second portion of the split string.

15. The encoder claimed in claim 13, wherein the processor is configured to form the phrases by forming each phrase to have a respective predetermined length.

16. The encoder claimed in claim 15, wherein the respective predetermined length of each phrase is dependent upon that phrase's associated probability estimate.

17. A decoder for decoding an encoded sequence, the encoded sequence having been encoded in accordance with a context model, the decoder comprising:
- a processor;
- a memory; and
- a decoding application stored in memory and containing instructions for causing the processor to
    - read an ordered set of two or more consecutive phrases from the encoded sequence, a first of the phrases in the set containing at least part of one string of arithmetically-encoded data, wherein the phrases have a respective predetermined length,
    - determine from the context model a probability estimate associated with the first of the phrases,
    - identify from the probability estimate of the first phrase, respective probability estimates associated with each of the other phrases in the set,
    - arithmetically decode at least a portion of each of the two or more phrases of the set in parallel in accordance with their respective associated probability estimates to create decoded phrase bits, and
    - update the context model based upon at least some of the decoded phrase bits,
    - wherein the respective probability estimates associated with each of the other phrases are determined without dependence upon decoding of the first of the phrases.

18. The decoder claimed in claim 17, wherein one of the phrases in one set of phrases ends with a first portion of a split string, and wherein a phrase in a subsequent set of phrases in the encoded sequence starts with a second portion of the split string.

19. The decoder claimed in claim 18, wherein the processor is configured to repeat the reading, determining, identifying, arithmetically decoding and updating for the subsequent set of phrases, and wherein the processor is further configured to buffer the first portion of the split string in memory, append the second portion of the split string to the first portion of the split string to form a completed string, and decode the completed string.

20. The decoder claimed in claim 17, wherein the processor is further configured to repeat the reading, determining, identifying, arithmetically decoding, and updating for each ordered set of phrases from the encoded sequence until the encoded sequence is decoded.

* * * * *